(12) United States Patent
Ohta et al.

(10) Patent No.: US 7,838,401 B2
(45) Date of Patent: Nov. 23, 2010

(54) SEMICONDUCTOR DEVICE AND MANUFACTURING METHOD THEREOF

(75) Inventors: Hiroyuki Ohta, Kawasaki (JP); Kenichi Okabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/550,727

(22) Filed: Aug. 31, 2009

(65) Prior Publication Data
US 2010/0003798 A1      Jan. 7, 2010

Related U.S. Application Data

(62) Division of application No. 11/438,684, filed on May 23, 2006, now Pat. No. 7,601,996.

(30) Foreign Application Priority Data
Jan. 16, 2006   (JP)   ............... 2006-007742

(51) Int. Cl.
*H01L 21/265*   (2006.01)
(52) U.S. Cl. .............. 438/520; 438/528; 438/554; 438/585; 438/586; 438/595; 257/E51.005; 257/E29.13
(58) Field of Classification Search .............. 438/520, 438/528, 554, 585, 586, 595; 257/E51.005, 257/E29.13
See application file for complete search history.

(56) References Cited

U.S. PATENT DOCUMENTS

| | | | |
|---|---|---|---|
| 6,153,920 | A | 11/2000 | Gossmann et al. |
| 7,122,435 | B2 | 10/2006 | Chidambaram et al. |
| 2005/0095765 | A1 | 5/2005 | Saiki et al. |
| 2006/0134872 | A1 | 6/2006 | Hattendorf et al. |
| 2006/0216900 | A1 | 9/2006 | Wang et al. |

FOREIGN PATENT DOCUMENTS

JP        2005-136351  A     5/2005

OTHER PUBLICATIONS

M. Togo et al., "Power-aware 65 nm Node CMOS Technology Using Variable VDD and Back-bias Control with Reliability Consideration for Back-bias Mode"; 2004 Symposium on VLSI Technology, Digest of Technical Papers, pp. 88-89, 2004.

*Primary Examiner*—Michelle Estrada
(74) *Attorney, Agent, or Firm*—Westerman, Hattori, Daniels & Adrian, LLP

(57) ABSTRACT

A semiconductor device comprises a field-effect transistor arranged in a semiconductor substrate, which transistor has a gate electrode, source/drain impurity diffusion regions, and carbon layers surrounding the source/drain impurity diffusion regions. Each of the carbon layers is provided at an associated of the source/drain impurity diffusion regions and positioned so as to be offset from the front edge of a source/drain extension in direction away from the gate electrode and to surround as profile the associated source/drain impurity diffusion region.

8 Claims, 8 Drawing Sheets

WITHOUT C+ IMPLANTATION

WITH C+ IMPLANTATION, BUT WITHOUT OFFSET

SEMICONDUCTOR DEVICE AND MANUFACTURING METHOD THEREOF

This is a divisional application of U.S. patent application Ser. No. 11/483,864, filed on May 23, 2006, currently pending, which claims the benefit of priority from the prior Japanese Patent Application No. 2006-007742, filed on Mar. 23, 2006, the entire contents of which are incorporated herein by references.

CROSS-REFERENCE TO RELATED APPLICATIONS

This patent application is based upon and claims the benefit of the earlier filing date of Japanese Patent Application No. 2006-007742 filed Jan. 16, 2006, the entire contents of which are incorporated herein by reference.

BACKGROUND OF THE INVENTION

1. Field of the Invention

The present invention generally relates to a semiconductor device and a manufacturing method thereof, and more particularly, to a semiconductor device with an improved structure suitable for wafer voltage control and with reliable operation of field effect transistors.

2. Description of the Related Art

In recent years and continuing, a technique for dynamically controlling the threshold voltage of a transistor to reduce power consumption caused by leakage current is attracting attention.

The lower the threshold voltage of a transistor, the higher the operating speed is. However, with lower threshold voltage, subthreshold leakage current involved in the ON/OFF switching operation increases, and consequently the power consumption increases. In contrast, if the threshold voltage is high, subthreshold current leakage decreases although the performance is degraded.

Making use of this feature, the threshold voltage is dynamically controlled by software so as to be at a lower level when high-speed operation is required and at a higher level if not.

It is known that the threshold voltage can be changed by controlling the wafer voltage of a transistor. See, for example, 2004 Symposium on VLSI Technology, Digest of Technical Papers, pp. 88-89, 2004 (Publication 1). However, it is difficult in fact to appropriately regulate the wafer voltage while maintaining the electric current characteristics of nanoscale transistors. As the gate length is narrowed, the source and drain diffusion layers get closer and interfere with each other, and the intended level of voltage cannot be acquired directly below the channel even though a wafer voltage of a designed level is applied. Thus, desired change in characteristics cannot be achieved.

Meanwhile, to prevent lateral diffusion of the source and drain regions, it is proposed to form a diffusion preventing amorphous layer in a part of the surface area directly below the sidewall spacers located on both sides of the gate electrode. See JP 2005-136351A (Publication 2).

FIG. 1 is a schematic diagram for illustrating a prior art technique for preventing lateral diffusion of the source and drain regions disclosed in Publication 2. A gate electrode 102 is formed via a gate insulator 109 on a semiconductor substrate 101. Extension regions 103 are formed by ion implantation using the gate electrode 102 as a mask. The first sidewall spacers 104 are formed, and diffusion preventing amorphous layers 106 are formed by implanting ions having an impurity diffusion preventing function (such as nitrogen (N), fluorine (F), or carbon (C)) using the gate electrode 102 and the first sidewall spacers 104 as masks, and by making the impurity-implanted layers in alignment with the first sidewall spacers 104 uncrystallized. Then, the second sidewall spacers 107 are formed. The source/drain regions 105 are formed by ion implantation using the gate electrode 102, the first sidewall spacers 104 and the second sidewall spacers 107 as masks.

The technique disclosed in Publication 2 is directed to prevent lateral diffusion of the source/drain regions by amorphous layers, and irrelevant to control of bias voltage applied to a wafer. Simple application of this technique to wafer voltage control cannot prevent dopants and impurities from migrating to the channel 110 passing beneath the diffusion preventing layer 106 although lateral diffusion of impurities may be prevented. As a result, interference occurs between the source and the drain, which interference adversely affects the wafer voltage being applied.

It may be proposed to control the width of the second sidewall spacer 107 to the optimum width in order to improve the effect of wafer bias voltage. By adjusting the width of the second sidewall spacer 107, the distance from the channel 110 to the source/drain regions 105 is increased and interference may be reduced; however, another problem occurs. That is, the ON-current decreases due to the increased distance between the channel and the source/drain regions 105.

SUMMARY OF THE INVENTION

The present invention is conceived in view of the above-described problems in the prior art, and the embodiments provide a semiconductor device with reliable wafer-voltage control ability and satisfactory characteristics of transistors. The embodiments also provide a fabrication method of such a semiconductor device.

In the embodiments, a carbon (C) layer is provided so as to surround the source/drain impurity diffusion region to prevent diffusion in all directions and to bring the wafer biasing effect to the maximum for precisely controlling the threshold voltage.

In one aspect of the invention, a semiconductor device comprises a field-effect transistor arranged in a semiconductor substrate, which transistor has a gate electrode, source/drain impurity diffusion regions, and carbon layers surrounding the source/drain impurity diffusion regions. Each of the carbon layers is provided to an associated one of the source/drain impurity diffusion regions and positioned so as to be offset from the front edge of the source/drain extension in a direction away from the gate electrode and to surround in profile (as viewed in cross section) the associated source/drain impurity diffusion region.

The source/drain impurity diffusion region is offset from the channel-side boundary of the carbon layer so as to be away from the gate electrode. This arrangement is effective for preventing junction leakage current.

The carbon layer is located deeper than the source/drain impurity diffusion regions in the semiconductor substrate. This arrangement can prevent impurities of the source and the drain from migrating to the channel region.

In another aspect of the invention, a method of manufacturing a semiconductor device is provided. The method comprises the steps of:

(a) forming a gate electrode via a gate insulating film on a semiconductor substrate;

(b) forming source/drain extension regions in the semiconductor substrate using the gate electrode as a mask;

(c) forming carbon layers such that each of the carbon layers is offset from the front edge of the associated source/drain extension region in a direction away from the gate electrode; and (d) forming source/drain impurity diffusion regions such that each of the source/drain impurity diffusion regions is offset from the channel-side boundary of the associated carbon layer so as to be away from the gate electrode and is located shallower than the depth-direction boundary of the carbon layer.

In forming the carbon layer, the method may further comprise the steps of (e) forming first sidewall spacers on both sides of the gate electrode after the source/drain extension regions are formed;

(f) introducing carbon ions in the semiconductor substrate using the gate electrode and the first sidewall spacers as masks;

(g) forming second sidewall spacers covering the first sidewall spacers; and (h) forming the source/drain impurity diffusion regions such that the peak of each of the source/drain impurity diffusion regions is located shallower than the boundary of the associated carbon layer.

In another example of the formation of the carbon layer, the method may further comprise the steps of:

(e) forming sidewall spacers on both sides of the gate electrode after the source/drain extension regions are formed;

(f) forming the source/drain impurity regions using the gate electrode and the sidewall spacers as masks; and (g) introducing carbon ions in the semiconductor substrate by oblique ion implantation using the gate electrode and the sidewall spacers as masks such that the carbon layer is located below the source/drain impurity diffusion regions.

In either example, the carbon layer is formed so as to surround in profile the source/drain impurity diffusion region. Consequently, the wafer voltage can be controlled in a reliable manner, while maintaining the transistor characteristics, in the semiconductor device.

With this semiconductor device, the threshold voltage of the transistor can be switched to a desired level by controlling the wafer voltage, while maintaining the characteristics of the miniaturized transistors.

BRIEF DESCRIPTION OF THE DRAWINGS

Other objects, features, and advantages of the present invention will become more apparent from the following detailed description when read in conjunction with the accompanying drawings, in which.

DETAILED DESCRIPTION OF THE PREFERRED EMBODIMENTS

The preferred embodiments of the invention are now described in conjunction with the attached drawings.

Figure 1:
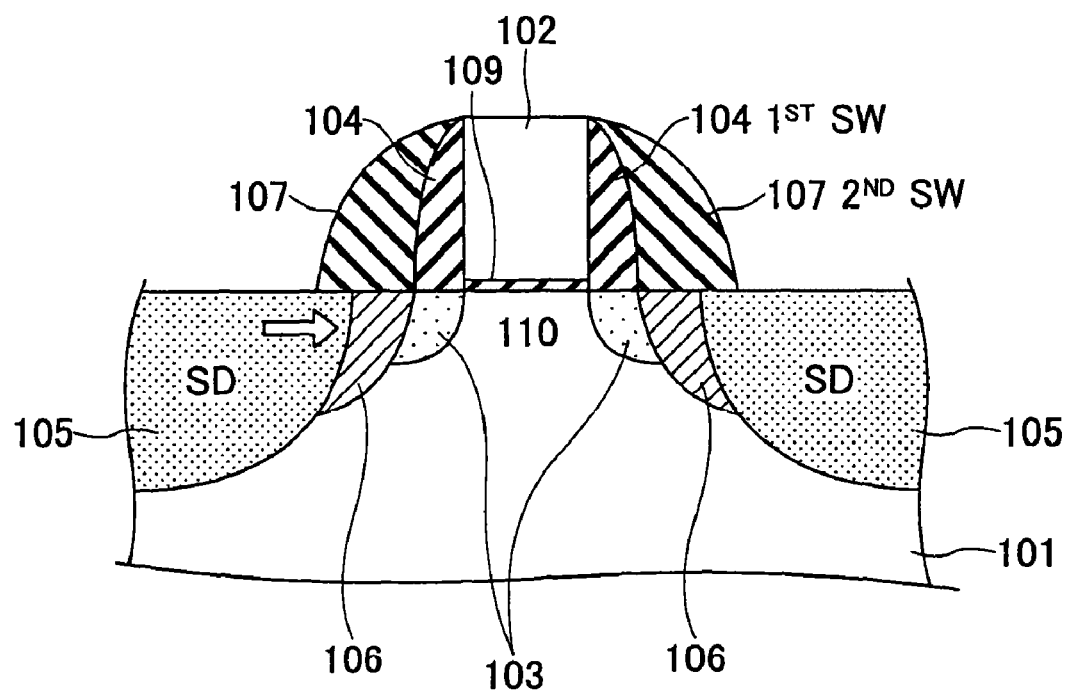
FIG. 1 illustrates a known structure for preventing lateral diffusion of the source/drain regions.
Figure 2:
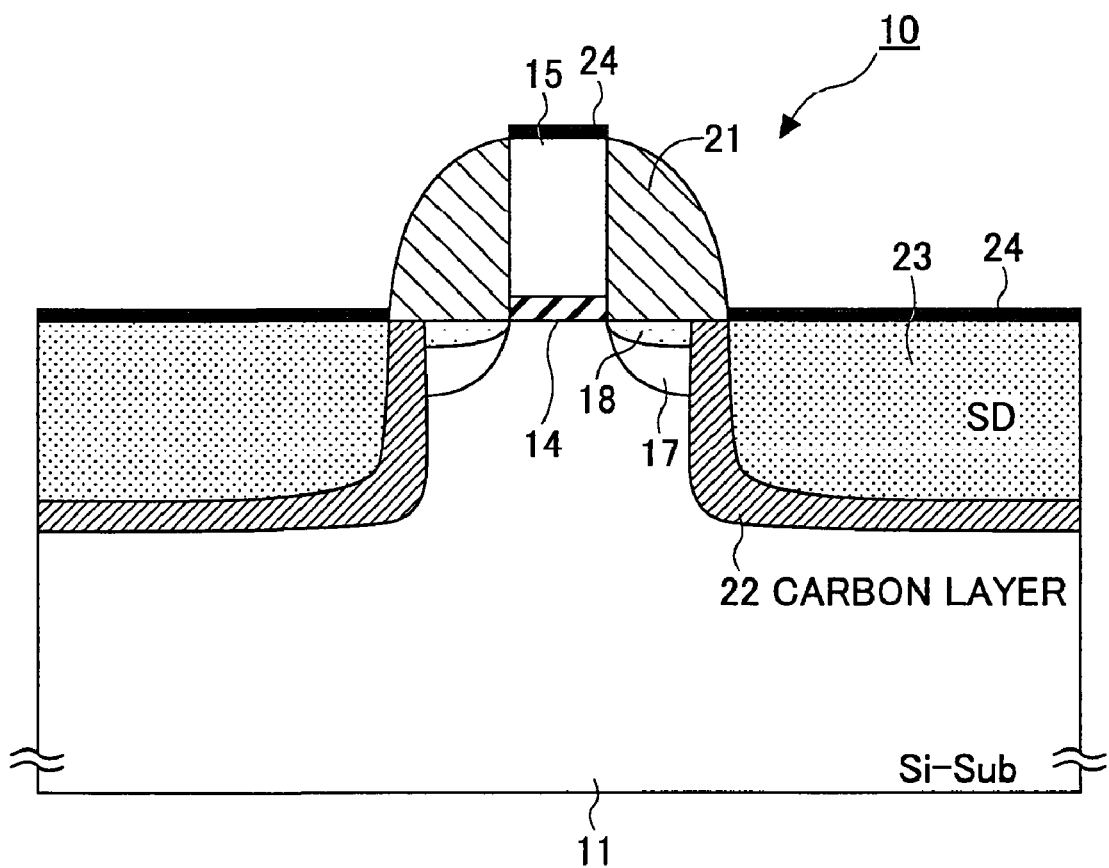
FIG. 2 is a schematic cross-sectional diagram of a semiconductor device according to an embodiment of the invention.

FIG. 2 is a schematic cross-sectional view of a semiconductor device 10 according to an embodiment of the invention. The semiconductor device 10 has a gate electrode 15 formed on the silicon (Si) substrate 11 via the gate insulating film 14, source/drain impurity diffusion regions (hereinafter, referred to simply as "source/drain regions" or "source and drain") 23 formed in the silicon substrate 10 and extending on both sides of the gate electrode 11, and carbon (C) layers 22 surrounding in Profile the source/drain regions 23. The top faces of the gate electrode 15 and the source/drain regions 23 are covered with a metal silicide 24 (such as nickel silicide).

The semiconductor device 10 also has source/drain extension regions (hereinafter, referred to simply as "source/drain extensions" or "extensions") 18 extending in the surface area of the silicon substrate 10 and aligning with the gate electrode 15, pocket regions 17, and sidewall spacers 21 provided on both sides of the gate electrode 15. The source/drain regions 23 align with the sidewall spacers 21.

Each of the carbon (C) layers 22 is offset from the front edge of the extension 18 in a direction away from the gate electrode 15 (OFFSET 1).

Each of the source/drain regions 23 is offset from the channel-side boundary of the carbon (C) layer 22 so as to be away from the gate electrode 15 (OFFSET 2), and is separated from the extension 18 by the carbon layer 22. The carbon layers 22 extend deeper in the silicon substrate 11 than the bottom lines of the source/drain regions 23, thereby surrounding in profile the source/drain regions 23.

By surrounding the source/drain regions 23 with the carbon layer 22, interference between the source and the drain in the silicon activate region directly below the gate electrode 15 can be prevented. This arrangement can also prevent the depleted layer from extending into the channel region and the ON-current from decreasing. Consequently, the wafer biasing effect can be pulled out to the maximum, and the threshold voltage can be controlled appropriately.

FIG. 3A through FIG. 3F illustrate a semiconductor device fabrication process according to the first embodiment of the invention. In this example, an NMOS transistor is fabricated.

Figure 3A:
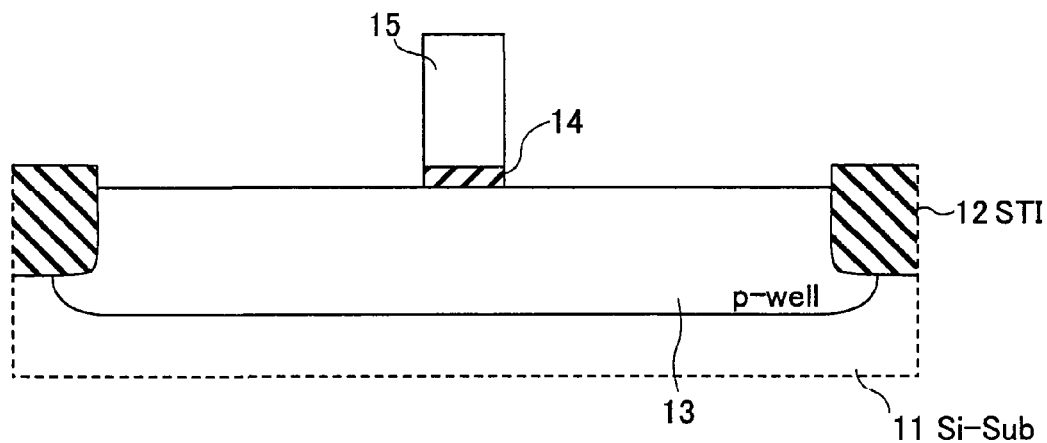
FIG. 3A through FIG. 3F illustrate a fabrication process of a semiconductor device according to the first embodiment of the invention.

As illustrated in FIG. 3A, device isolations such as shallow trench isolation (STI) regions 12 are formed in a p-type silicon substrate 11, and a p-well 13 is formed in a prescribed area by implanting, for example, boron (B) ions. Then, channel implantation is performed by introducing boron (B) ions in the p-well 13 at acceleration energy of 5-20 keV and dose of $0.1 \times 10^{13}$ cm$^{-2}$ to $2.0 \times 10^{13}$ cm$^{-2}$, and additional channel implantation is performed by introducing indium (In) ions at 34-180 keV and $0.1 \times 10^{13}$ cm$^{-2}$ to $5.0 \times 10^{13}$ cm$^{-2}$.

Then, an insulating film with a thickness of 0.7 nm to 1.5 nm is formed over the entire surface by thermal oxidation, and a polycrystalline silicon layer with a thickness of 50 nm to 150 nm is formed over the insulating film. The polycrystalline silicon layer and the insulating film are patterned into the gate electrode 15 with a gate length of 40 nm and the gate insulating film 14, respectively.

Figure 3B:
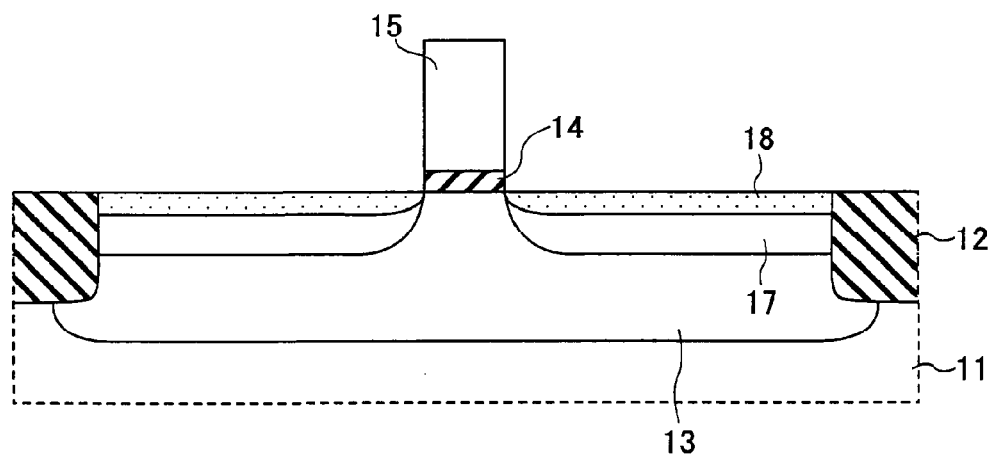

Then, as illustrated in FIG. 3B, pocket regions 17 are formed by performing ion implantation of indium (In) in four directions at 30-100 keV and $0.1 \times 10^{13}$ cm$^{-2}$ to $3.0 \times 10^{13}$ cm$^{-2}$ using the gate electrode 15 as a mask, and subsequently n-type extensions 18 are formed by performing ion implantation of arsenic (As) at 0.5-10 keV and $0.5 \times 10^{15}$ cm$^{-2}$ to $5.0 \times 10^{15}$ cm$^{-2}$. Providing the pocket regions 17 can achieve a steep impurity distribution profile in the channel direction, and the short channel effect can be restricted.

Figure 3C:
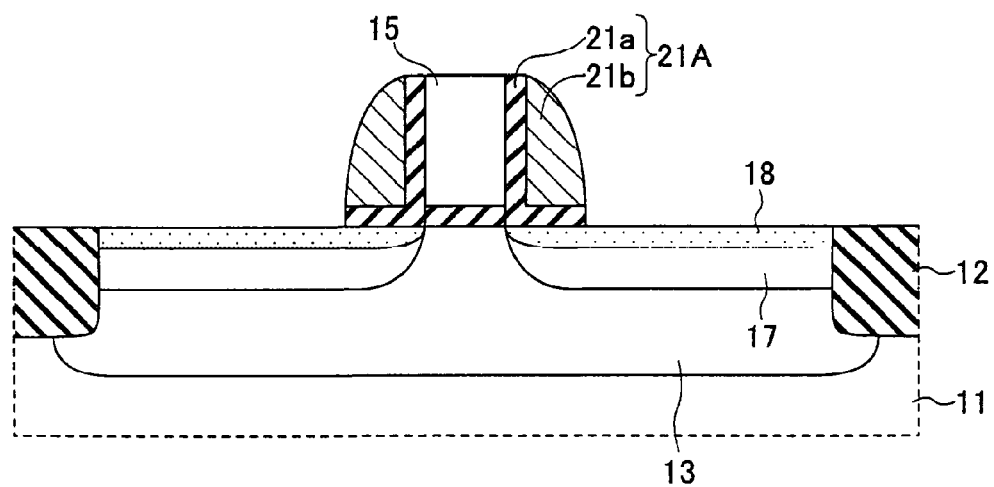

Then, as illustrated in FIG. 3C, a thin silicon oxide film 21a with a thickness of about 10 nm and a relatively thick silicon nitride film 21b are successively deposited over the entire surface, and etched back by anisotropic etching to form the first sidewall spacer 21A. The first sidewall spacer 21A consists of an L-shaped silicon oxide film 21a in a cross-sectional view and a silicon nitride film 21b covering the L-shaped silicon oxide film 21a. The width or the thickness of the first sidewall spacer 21A is substantially the same as the total thickness of the silicon oxide film 21a and the silicon nitride film 21b. In this example, the thickness of the first sidewall spacer 21A is 30 nm to 50 nm.

Figure 3D:
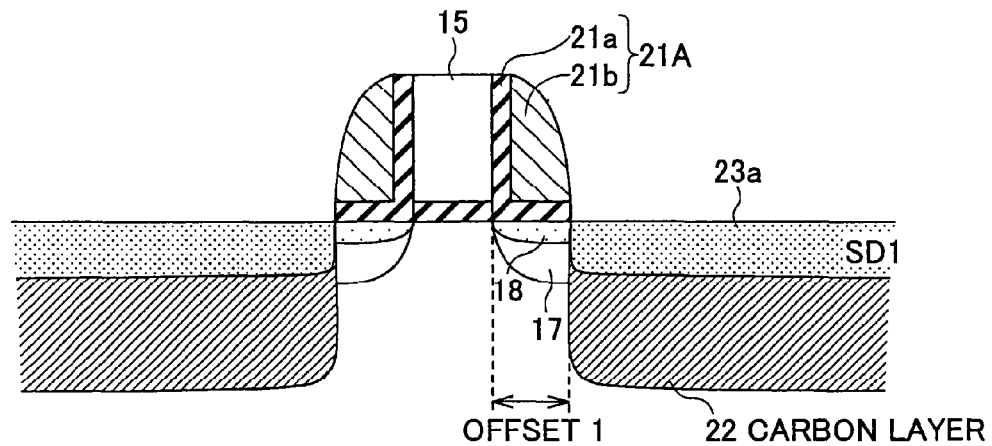

Then, as illustrated in FIG. 3D, a first part 23a of the source/drain region 23 is formed in the surface area of the silicon substrate 11 by implanting arsenic (As) ions at acceleration energy of 5-15 keV and dose of $1.0 \times 10^{15}$ cm$^{-2}$ to $5.0 \times 10^{15}$ cm$^{-2}$ using the gate electrode 15 and the first sidewall spacer 21A as masks. Then, a carbon layer 22 is formed by ion implantation of carbon (C) such that the peak of the carbon layer 22 is located under the bottom of the first part 23a of the source/drain region 23. The acceleration energy of the carbon ion implantation is 3-10 keV (for example, 5 keV), and the dose is $0.1 \times 10^{14}$ cm$^{-2}$ to $5.0 \times 10^{14}$ cm$^{-2}$.

Because of the existence of the first sidewall spacer 21A, the carbon layer 22 is offset from the front edges of the source/drain extension 18 and the pocket region 17 in a direction away from the gate electrode 15. The offset amount (OFFSET 1) is defined by the thickness of the first sidewall spacer 21A.

Figure 3E:
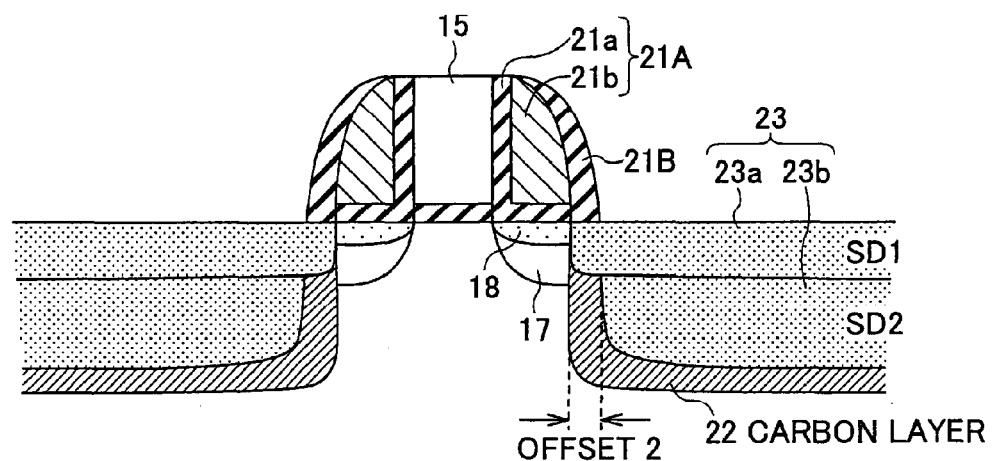

Then, as illustrated in FIG. 3E, a silicon oxide film is deposited over the entire surface and etched back by anisotropic etching to form a second sidewall spacer 21B that covers the first sidewall spacer 21A. The thickness of the second sidewall spacer 21B is controlled by the thickness of the silicon oxide film. The thickness of the second sidewall spacer 21B becomes a parameter for determining the offset amount (OFFSET 2) of the source drain impurity diffusion region to be formed subsequently with respect to the channel-side boundary of the carbon layer 22. In this example, the second offset amount is about 30 nm.

Then, a second part 23b of the source/drain region 23 is formed by implanting phosphorous (P) ions at 5-10 keV and $6.0 \times 10^{15}$ cm$^{-2}$ to $2.0 \times 10^{16}$ cm$^{-2}$ using the gate electrode 15 and the first and second sidewall spacers 21A and 21B as masks. The second part 23b of the source/drain region 23 is offset from the channel-side boundary of the carbon layer 22 so as to be away from the gate electrode 15, and is offset from the bottom (or the depth-direction boundary) of the carbon layer 22 internally. In this manner, the source/drain region 23 is completely encompassed by the carbon layer 22. This structure can avoid undesirable situations where the source/drain extension 18 becomes unnecessarily long, and accordingly, the ON-current can be maintained at an appropriate level.

Figure 3F:
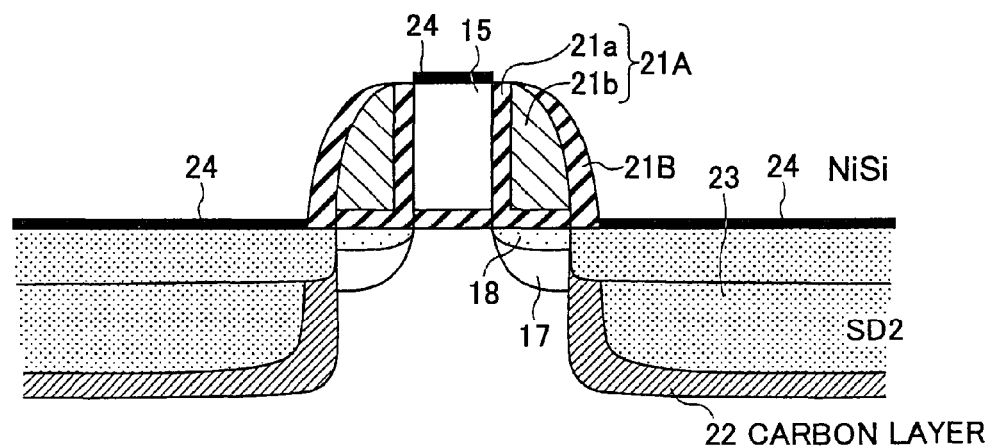

Then, as illustrated in FIG. 3F, activation annealing is performed at about 1000° C. in a nitrogen atmosphere to activate the implanted impurity ions. Then, a nickel (Ni) film is formed over the entire surface, which film is silicided by a thermal process to cover the exposed surface of the gate electrode 15 and the source/drain regions 23 with nickel silicide (NiSi) 24.

FIG. 4A through FIG. 4F illustrate a semiconductor device fabrication process according to the second embodiment of the invention. In the first embodiment, the second sidewall spacer 21 is formed to make the source/drain regions 23 offset from the channel-side boundary of the carbon layer 22 so as to be away from the gate electrode 15. In contrast, in the second embodiment, the carbon layer 22 surrounding the source/drain region 23 is formed by oblique ion implantation, without forming the second sidewall spacer.

Figure 4A:
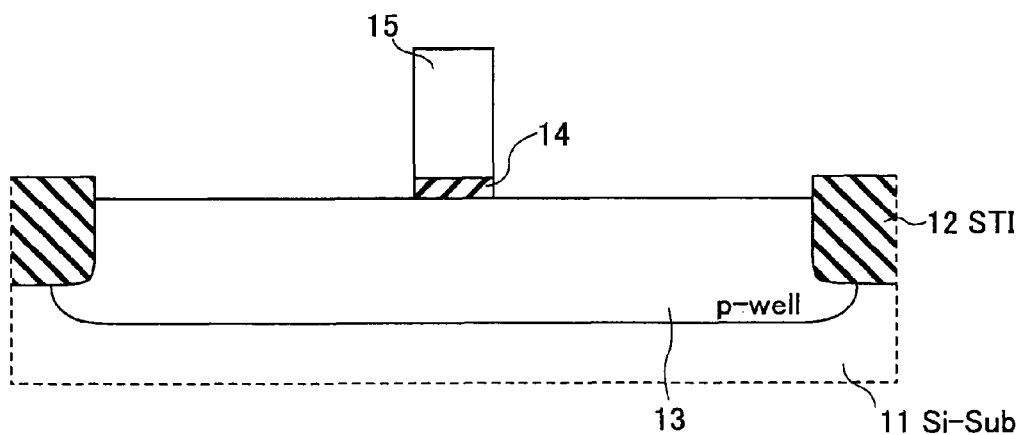
FIG. 4A through FIG. 4F illustrate a fabrication process of a semiconductor device according to the second embodiment of the invention.
Figure 4B:
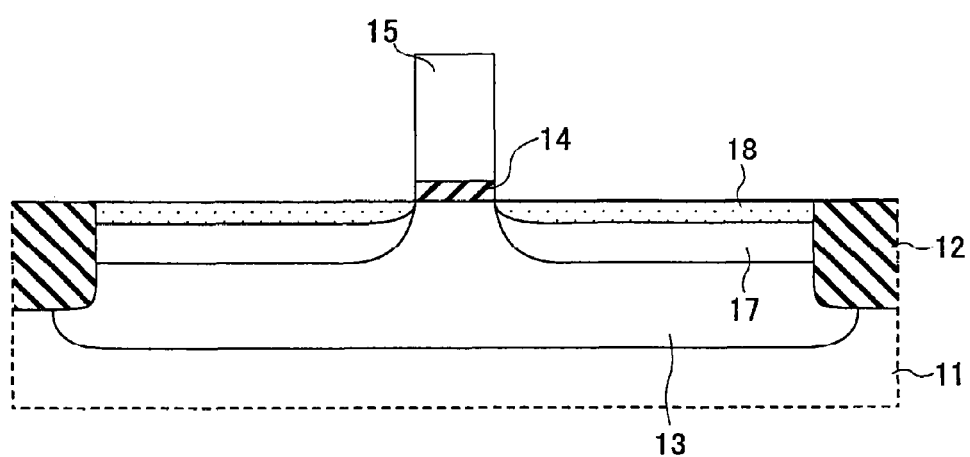

FIG. 4A and FIG. 4B are the same as those shown in FIG. 3A and FIG. 3B, in which a gate electrode 15 and an insulating film 14 of an NMOS transistor are formed on the silicon substrate 11, and the pocket region 17 and the source/drain extension 17 are formed using the gate electrode 15 as a mask.

Figure 4C:
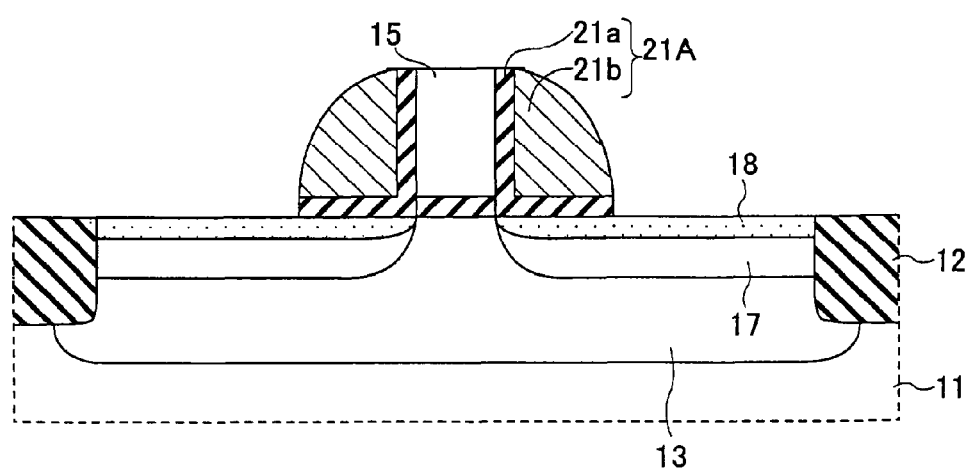

Then, as illustrated in FIG. 4C, a thin silicon oxide film 21a with a thickness of about 10 nm and a relatively thick silicon nitride film 21b with a thickness of 50 nm to 80 nm are successively deposited over the entire surface, and etched back by anisotropic etching to form a first sidewall spacer 21A. The sidewall spacer 21A consists of an L-shaped silicon oxide film 21a in a cross-sectional view and a silicon nitride film 21b covering the L-shaped silicon oxide film 21a. The width or the thickness of the sidewall spacer 21A is substantially the same as the total thickness of the silicon oxide film 21a and the silicon nitride film 21b. The thickness or the width of the sidewall spacer 21A is a factor for defining the position of the channel-side boundary of the source/drain region formed in the subsequent step. In this example, the thickness of the sidewall spacer 21A is 60 nm to 90 nm.

Figure 4D:
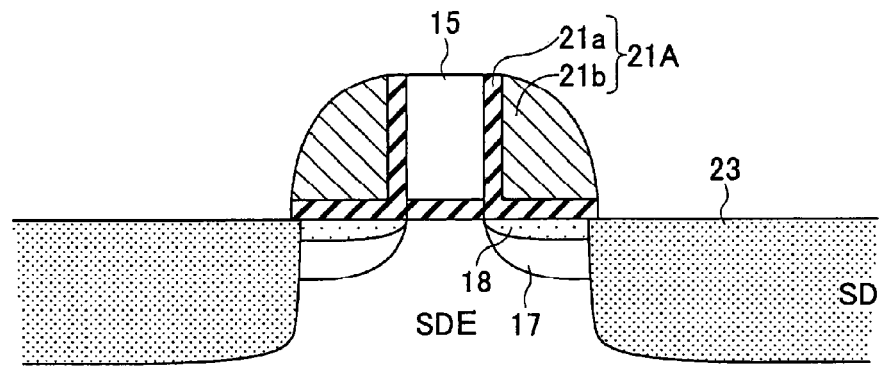

Then, as illustrated in FIG. 4D, source/drain regions 23 are formed in the silicon substrate 11 by implanting phosphor (P) ions at acceleration energy of 5-10 keV and dose of $6.0 \times 10^{15}$ cm$^{-2}$ to $2.0 \times 10^{16}$ cm$^{-2}$ using the gate electrode 15 and the sidewall spacer 21A as masks.

Figure 4E:
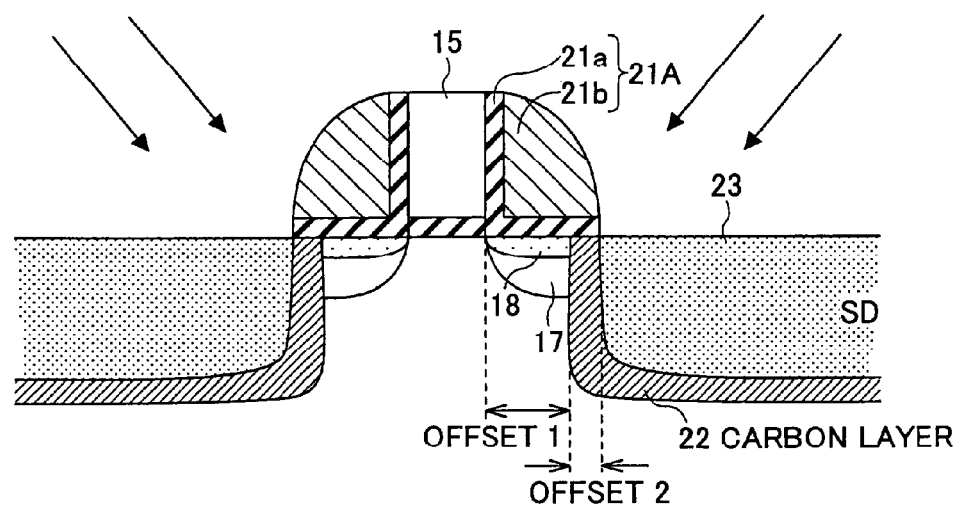

Then, as illustrated in FIG. 4E, carbon ions are implanted in the silicon substrate 11 by oblique ion implantation such that the peak concentration of the carbon layer 22 is located under the bottom of the source/drain regions 23. The conditions of the oblique ion implantation are acceleration energy of 3-10 keV and dose of 0.025 $6.0 \times 10^{15}$ cm$^{-2}$ to $2.0 \times 10^{16}$ cm$^{-2}$, rotated in four directions at an oblique angle of 18-30° (so that the total dose becomes $0.1 \times 10^{14}$ cm$^{-2}$ to $5.0 \times 10^{14}$ cm$^{-2}$).

The channel-side boundary of the carbon layer 22 formed by the oblique ion implantation is offset from the front edge of the source/drain extension 18 (or the pocket 17) because of the existence of the sidewall spacer 21 (OFFSET 1). In addition, the channel-side boundary and depth-direction boundary of the source/drain regions 23 are offset to the inside of the boundary or the cross-sectional profile of the carbon layer 22 (OFFSET 2) in accordance with the implanting condition. Consequently, the source/drain regions 23 are surrounded by the carbon layers 22.

Figure 4F:
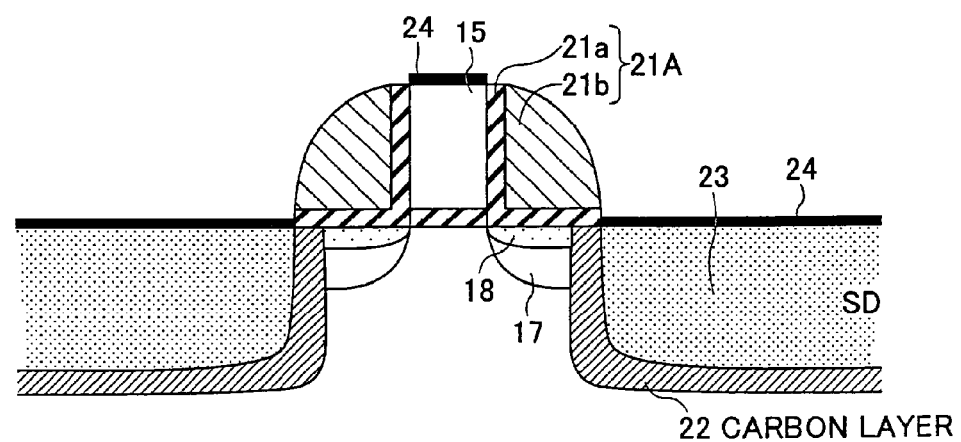

Then, as illustrated in FIG. 4F, activation annealing is performed at about 1000° C. in the nitrogen atmosphere to activate the implanted ions. Then, a nickel (Ni) film is formed over the entire surface, which film is silicided by a thermal process to cover the exposed surface of the gate electrode 15 and the source/drain regions 23 with nickel silicide (NiSi) 24.

The fabrication method of the second embodiment does not require two steps for formation of the sidewall spacers to surround the source/drain region 23 by the carbon layer 22.

Figure 5A:
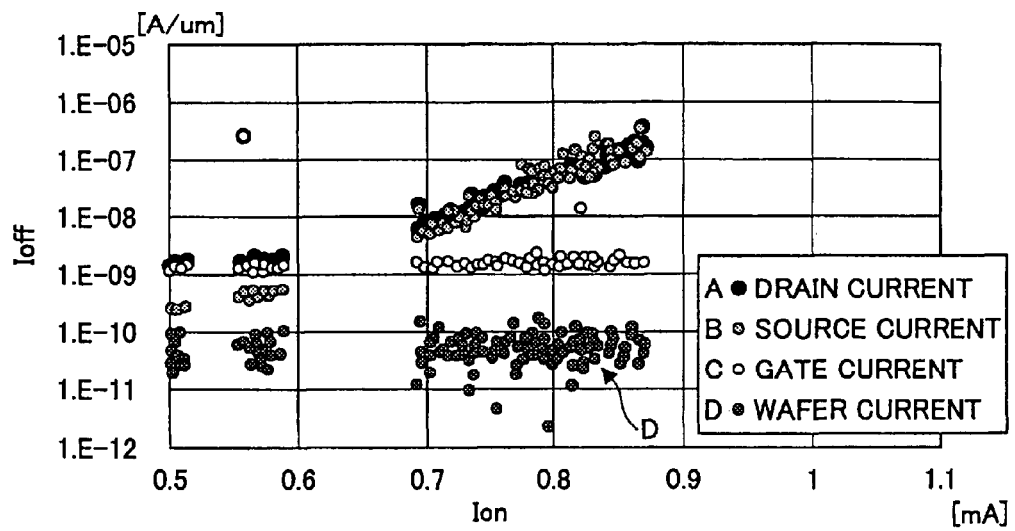
FIG. 5A and FIG. 5B are graphs used to explain the basis for providing the carbon (C) layer so as to be offset from the front edge of the source/drain extension.
Figure 5B:
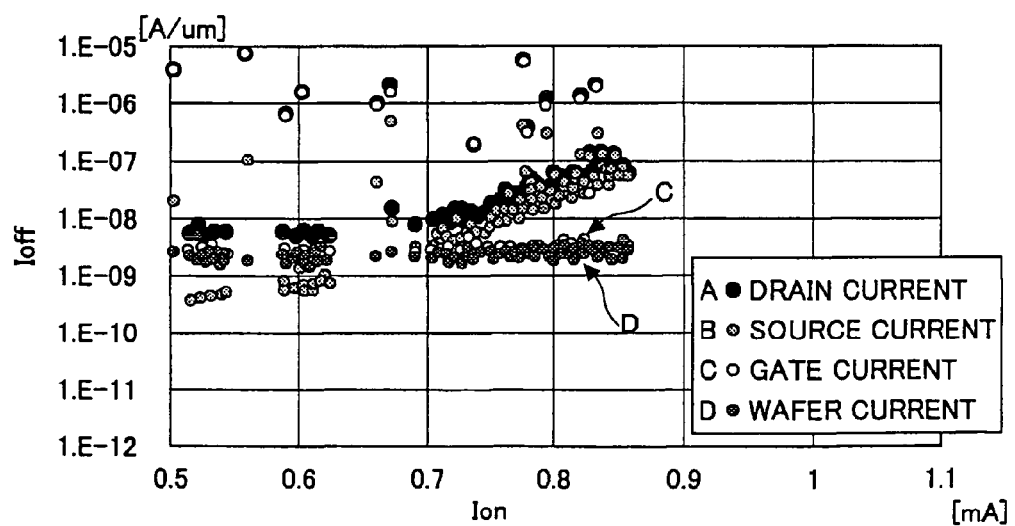

FIG. 5A and FIG. 5B are graphs used to explain the basis of offsetting the carbon layer 22 from the front edge of the source/drain extension 18 by a prescribed distance. FIG. 5A is a graph of the off-leakage current of a conventional semiconductor device without a carbon layer surrounding the source/ drain region, and FIG. 5B is a graph of the off-leakage current of a semiconductor device with a carbon layer formed but without offset from the front edge of the source/drain extension.

Data sets A and B represent off-leakage current (A/μm) flowing in the drain and the source, respectively, at substantially the same levels. Data set C represents off-leakage current flowing in the gate electrode, and data set D represents off-leakage current flowing through the wafer. If the carbon layer is formed without offset from the front edge of the source/drain extension, the wafer current increases by two orders of magnitude, which phenomenon is speculated to be due to increase of junction leakage current. To avoid this, the carbon layer is offset from the front edge of the source/drain extension so as to be away from the gate electrode in the embodiments, and actually, the off-leakage current is reduced.

Figure 6:
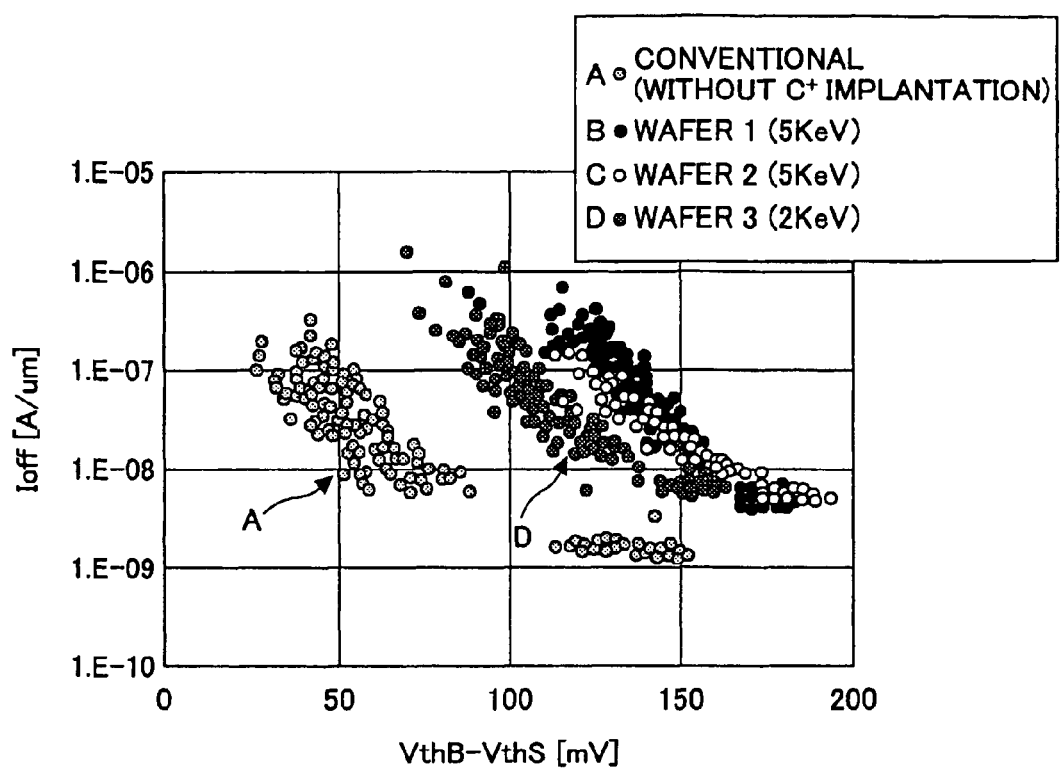
FIG. 6 is a graph showing the wafer biasing effect improved by the carbon layers surrounding the source/drain impurity diffusion regions.

FIG. 6 is a graph showing the wafer biasing effect improved by the carbon layers. In the graph, the horizontal axis represents swing of threshold voltage (VthB-VthS) between with and without application of a bias voltage to the wafer, and the vertical axis represents the off-leakage current. Data set A represents off-leakage current flowing in a conventional semiconductor wafer without a carbon layer surrounding the source/drain region. Data sets B and C represent off-leakage currents in sample wafer 1 and wafer 2 in which carbon ions are implanted at 5 keV to form the carbon layers as in the embodiments of the invention, and data set D represents off-leakage current in a comparison sample wafer 3 in which carbon ions are implanted at 2 keV.

In wafer 1 and wafer 2, carbon ions are implanted deeper in the silicon substrate than the bottom of the source/drain regions such that the source/drain region is surrounded in profile by the carbon layer. Consequently, undesirable expansion of the impurity ions is prevented during the activation annealing, and interference between the source and the drain can be reduced. In addition, it is assumed that the droop of the source/drain extension 18 is made steep.

As is clearly shown in FIG. 8, the swing of threshold voltage is improved in wafers 1 and 2 by 100 mV, as compared with a conventional wafer without carbon layers, at the same off-leakage current level.

If the carbon layer is formed at a lower acceleration energy of 2 keV (wafer 3), the wafer biasing effect is improved as compared with the conventional wafer without carbon layers, but migration of impurity ions from the source/drain regions to the channel region cannot be sufficiently prevented.

Since the same characteristics are acquired in wafer 1 and wafer 2, the fabrication methods of the embodiments are superior in reproducibility, and the wafer voltage can be controlled appropriately by simply regulating the implantation energy of carbon ions.

Although the preferred embodiments are described using an NMOS transistor as an example, the techniques of the embodiments can be applied to PMOS transistors. In addition, the above-described techniques can be applied not only to MOSFETs, but also other types of field-effect transistors including MISFETs and MEFETs.

What is claimed is:

1. A method of manufacturing a semiconductor device comprising the steps of:
    forming a gate electrode via a gate insulating film on a semiconductor substrate;
    forming source/drain extension regions in the semiconductor substrate using the gate electrode as a mask;
    forming carbon layers such that each of the carbon layers is offset from the front edge of the associated source/drain extension region in a direction away from the gate electrode;
    forming source/drain impurity diffusion regions such that each of the source/drain impurity diffusion regions is offset from the channel-side boundary of the associated carbon layer so as to be away from the gate electrode and is located shallower than the depth-direction boundary of the carbon layer; and
    forming a pocket region in the semiconductor substrate such that the associated source/drain extension region is located shallower than the pocket region,
    wherein the carbon layer is formed so as to be offset from the front edges of the pocket region and the source/drain extension region in the direction away from the gate electrode.

2. The method of manufacturing a semiconductor device according to claim 1, further comprising the steps of:
    forming first sidewall spacers on both sides of the gate electrode after the source/drain extension regions are formed;
    introducing carbon ions in the semiconductor substrate using the gate electrode and the first sidewall spacers as masks;
    forming second sidewall spacers covering the first sidewall spacers; and
    forming the source/drain impurity diffusion regions such that a peak of each of the source/drain impurity diffusion regions is located shallower than the boundary of the associated carbon layer.

3. The method of manufacturing a semiconductor device according to claim 1, further comprising the steps of:
    forming first sidewall spacers on both sides of the gate electrode after the source/drain extension regions are formed;
    forming a first part of the source/drain impurity diffusion region in the surface area of the semiconductor substrate using the gate electrode and the first sidewall spacer as masks;
    introducing carbon ions in the semiconductor substrate using the gate electrode and the first sidewall spacers as masks such that the peak of the carbon layer is located below a bottom of the first part of the source/drain impurity diffusion region;
    forming second sidewall spacers covering the first sidewall spacers; and
    forming a second part of the source/drain impurity diffusion regions such that a peak of the second part of the source/drain impurity diffusion regions is located shallower than the boundary of the carbon layer.

4. The method of manufacturing a semiconductor device according to claim 1, further comprising the steps of:
    forming sidewall spacers on both sides of the gate electrode after the source/drain extension regions are formed;
    forming the source/drain impurity regions using the gate electrode and the sidewall spacers as masks; and
    introducing carbon ions in the semiconductor substrate by oblique ion implantation using the gate electrode and the sidewall spacers as masks such that a peak of the carbon layer is located below the source/drain impurity diffusion regions.

5. The method of manufacturing a semiconductor device according to claim 4, wherein the oblique ion implantation of carbon ions is performed such that the carbon layer is offset from the front edge of the source/drain extension region in the direction away from the gate electrode and that the carbon layer surrounds in profile the source/drain impurity diffusion region.

6. The method of manufacturing a semiconductor device according to claim 1, wherein the carbon layer is formed by ion implantation at acceleration energy of 3 keV to 10 keV.

7. A method of manufacturing a semiconductor device comprising:
  forming a gate insulating film on a semiconductor substrate;
  forming a gate electrode on the gate insulating film;
  implanting first impurities into the semiconductor substrate to form source/drain extension regions in the semiconductor substrate using the gate electrode as a mask;
  implanting second impurities into the semiconductor substrate to form a pocket region in the semiconductor substrate using the gate electrode as a mask such that the associated source/drain extension region is located shallower than the pocket region;
  after forming the source/drain extension region and the pocket region, forming first sidewall spacers on both sides of the gate electrode;
  implanting carbon into the semiconductor substrate to form carbon layers in the semiconductor substrate using the gate electrode and the first side wall as masks; and
  implanting third impurities into the semiconductor substrate to form source/drain impurity diffusion regions such that each of the source/drain impurity regions is located shallower than the carbon layers.

8. The method of manufacturing the semiconductor device according to claim 7, wherein each of the carbon layers is offset from an edge of the associated source/drain extension region in a direction away from the gate electrode.

* * * * *